United States Patent [19]
Gilmore

[11] Patent Number: 5,028,887
[45] Date of Patent: Jul. 2, 1991

[54] DIRECT DIGITAL SYNTHESIZER DRIVEN PHASE LOCK LOOP FREQUENCY SYNTHESIZER WITH HARD LIMITER

[75] Inventor: Robert P. Gilmore, San Diego, Calif.

[73] Assignee: Qualcomm, Inc., San Diego, Calif.

[21] Appl. No.: 502,101

[22] Filed: Mar. 29, 1990

Related U.S. Application Data

[63] Continuation-in-part of Ser. No. 401,152, Aug. 31, 1989, Pat. No. 4,965,533.

[51] Int. Cl.$^5$ .......................... H03K 3/80; H03L 7/18
[52] U.S. Cl. ........................................ 331/18; 328/14; 331/25; 364/721
[58] Field of Search ...................... 331/1 A, 2, 18, 25; 328/14; 364/721

[56] References Cited

U.S. PATENT DOCUMENTS

| | | | |
|---|---|---|---|
| 4,263,565 | 4/1981 | Astle | 331/25 X |
| 4,413,236 | 11/1983 | Sochor | 331/25 |
| 4,516,084 | 5/1985 | Crowley | 331/25 X |
| 4,835,491 | 5/1989 | Coster | 331/2 |
| 4,841,256 | 6/1989 | Gastgeb | 331/25 |

*Primary Examiner*—Siegfried H. Grimm
*Attorney, Agent, or Firm*—Russell B. Miller

[57] ABSTRACT

A frequency synthesizer which uses a direct digital synthesizer (DDS) to generate a highly accurate periodic signal of a frequency selected from a plurality of reference frequencies. The DDS output signal is bandpass filtered and amplitude limited to reduce spurious noise. In one embodiment, the DDS frequency synthesizer is coupled to a phase lock loop which receives the DDS generated reference signal and a divide-by-N signal for generating an output signal at a frequency determined by the divide-by-N signal. The frequency resolution of the phase lock loop is N times the reference signal. In a second embodiment, the DDS is incorporated within the feedback path of the phase lock loop. An input reference frequency signal is provided to the phase lock loop with the DDS clock signal provided as a function of the phase lock loop output frequency. The DDS receives an input frequency control signal which determines the DDS step size. The synthesizer output frequency is a function of the input reference frequency, the number of bits in the digital word of the frequency control signal and the DDS step size as determined by the frequency control signal. Optional dividers may be provided in the feedback path which may further affect the synthesizer output frequency.

32 Claims, 5 Drawing Sheets

DIRECT DIGITAL SYNTHESIZER DRIVEN PHASE LOCK LOOP FREQUENCY SYNTHESIZER WITH HARD LIMITER

BACKGROUND OF THE INVENTION

I. Field of the Invention

This application is a continuation-in-part application of application Ser. No. 07/401,152, filed on Aug. 31, 1989, for "DIRECT DIGITAL SYNTHESIZER DRIVEN PHASE LOCK LOOP FREQUENCY SYNTHESIZER" and now U.S. Pat. No. 4,965,533. In general, the present invention relates to frequency synthesizers. More specifically, the present invention relates to a novel and improved apparatus and method for frequency synthesis utilizing a direct digital synthesizer (DDS) capable of generating any one of a plurality of periodic reference signals, each having a different periodic frequency.

II. Description of the Related Art

Conventional frequency synthesis is often accomplished with the use of one or more phase lock loops. A phase lock loop is designed to output a signal at a range of frequencies with frequency resolution, or step size, equal to the loop reference frequency.

Conventional phase lock loops synthesize a frequency by using a control voltage to drive a voltage controlled oscillator (VCO) which generates a signal of a frequency near the desired frequency. A frequency divider is used, to divide the VCO signal output frequency by an integer value. The integer value is chosen such that if the VCO were generating exactly the desired frequency, the resultant divided frequency signal would be exactly the same reference frequency.

The divided frequency signal is input along with the reference frequency signal to a phase detector. The phase detector compares the phase of the two input signals and outputs a voltage proportional to the difference in phase of the two input signals. The output of the phase detector is coupled through a loop filter, necessary to insure loop stability, where it is input to the VCO as the control voltage. Accordingly, the output signal from the VCO is adjusted to a frequency exactly that of the desired frequency.

The performance of a phase lock loop is related to several factors including (1) the frequency of the reference signal, (2) the magnitude of the divisor necessary to divide the output frequency down to the reference frequency, and (3) the bandwidth of the loop filter. The frequency of the reference signal dictates the frequency resolution, or step size of the loop, i.e. the smaller the reference frequency, the greater the frequency resolution. The magnitude of the loop divisor has great impact on the noise performance of the loop. As such, any phase noise or spurious noise in the reference frequency will appear in the loop output having its original magnitude multiplied by the loop divisor. The bandwidth of the loop filter, which is normally five to ten percent of the reference frequency, impacts the speed with which the loop can settle on a new frequency. Thus the narrower the loop filter bandwidth, the slower the loop will be able to settle on the new frequency.

These performance factors suggest the difficulty in designing a phase lock loop with narrow channel spacing, while maintaining a broad range of output frequencies. If the VCO output signal frequency is very large relative to the reference signal frequency (and therefore the frequency step size), the loop divisor must be very large. Therefore, any noise in the reference signal will appear on the loop output multiplied by a very large value. For this reason, conventional frequency synthesizers often comprise two or more phase lock loops. Each phase lock loop is of differing frequency resolution and corresponding output frequency range. In such a configuration the output of a coarse resolution loop, with a relatively large frequency range, can be mixed with the output of a fine resolution loop with a narrow frequency range. This combination of coarse and fine resolution loops results in a loop which is capable of providing a narrow frequency step size over a broad range of frequencies.

There are many disadvantages to the conventional multiple loop phase lock loop synthesizer. Increasing the number of loops increases the quantity and cost of required hardware, as well as the power and space requirements of the synthesizer. Also, although employing a separate fine resolution loop of limited output range narrows frequency step size, there remains a tradeoff between this resolution and switching speed. This tradeoff exists because the bandwidth of the loop filter, which dictates the switching speed, can be no more than five to ten percent of the reference frequency (and therefore the frequency step size). A further disadvantage of a multiple loop synthesizer is the mixing of the loop outputs creates substantial undesirable wideband spurious noise in the resultant output signal.

Frequency synthesis may also be accomplished using a direct digital synthesizers (DDS). A DDS can be utilized to provide a periodic signal variable in frequency over a bandwidth with fine frequency resolution. The DDS produces digitized periodic frequencies by accumulating phase at a higher rate consistent with sampling theory, translating the phase into a periodic waveform via a lookup table, and converting the resulting digital representation of the periodic wave to an analog signal using a digital to analog converter. The DDS output signal, however, can contain amplitude modulated (AM) noise spurs due to quantizaton errors and thermal noise in the DDS. It is therefore desirable to eliminate these spurs from the DDS output signal.

It is, therefore, an object of the present invention to provide a novel and improved frequency synthesizer in the form of a direct digital synthesizer (DDS) in which spurious noise in the output signal is substantially reduced or tailored to produce specific frequency components in the output signal.

It is also an object of the present invention to provide a novel and improved phase lock loop frequency synthesizer which requires substantially less hardware, space, and power than the conventional phase lock loop and multi-loop frequency synthesizer.

It is a further object of the present invention to provide a novel and improved phase lock loop frequency synthesizer which requires only one phase lock loop, yet has substantially greater frequency resolution and frequency range than the conventional single or multi-loop frequency synthesizer.

Yet another object of the present invention is to provide a novel and improved phase lock loop frequency synthesizer which has substantially faster frequency switching time than a conventional frequency synthesizer of comparable frequency resolution and frequency range.

It is still a further object of the present invention to provide 'a novel and improved phase lock loop frequency synthesizer which has substantially less wideband spurious noise in its output than the conventional multi-loop frequency synthesizer of comparable frequency resolution and frequency range.

SUMMARY OF THE INVENTION

The present invention is a novel improved method and apparatus for synthesizing frequencies. In the preferred embodiments the output of a direct digital synthesizer (DDS) is provided, either directly or though a filter, as an input of a hard limiter.

As mentioned previously, a DDS can be utilized to provide a periodic signal variable in frequency over a bandwidth with fine frequency resolution. The DDS output signal, however, can contain amplitude modulated (AM) noise spurs due to quantizaton errors of the DDS. These noise spurs can be filtered out of the DDS output signal utilizing a hard limiter in combination with a filter.

When the DDS analog output signal is provided directly to the limiter, which limits the amplitude of the DDS output signal, spurious noise is eliminated except for higher uneven order harmonics of the generated fundamental frequency. The output of the limiter may be input to a filter, typically a bandpass filter, to eliminate the frequency harmonics. The output of the filter thus is a clean, analog signal at the desired fundamental frequency containing phase modulated (PM) spurious signals only.

In the alternative, the DDS analog output signal is provided directly to a filter, typically a bandpass filter, which eliminates the out of band noise spurs. The filtered output signal is then provided to the limiter which eliminates the spurs, except for the higher uneven order harmonics of the fundamental frequency, and phase modulated (PM) spurious signals. This type of signal may be characterized as containing the frequency components of a square wave. A signal of this type is particularly useful in digital circuits for uses such as clock signals.

An implementation of the present invention is illustrated in the form of phase lock loop frequency synthesizer in which a DDS is used to provide the loop reference frequency to the phase lock loop. The DDS generated analog signal serves as a source of reference frequency for the phase lock loop. The phase lock loop frequency synthesizer makes coarse output frequency adjustments, in increments of the nominal reference frequency, by varying the loop divisor value. The phase lock loop frequency synthesizer further makes fine output frequency adjustments by varying the DDS output frequency, e.g. the source of the phase lock loop reference frequency. Therefore, the fine adjustment increment is the frequency resolution of the DDS output multiplied by the value of the loop divisor.

In a DDS driven phase lock loop frequency synthesizer, the phase lock loop can operate with a relatively high nominal reference frequency, thus allowing for a loop filter of relatively wide bandwidth. Accordingly the phase lock loop can operate with a relatively fast switching time. In such a phase lock loop, very fine output frequency step size changes may be realized because the step size is the loop divisor multiplied by the DDS frequency resolution. Such step size changes are typically several orders of magnitude finer than a conventional fine tune phase lock loop.

A DDS driven phase lock loop frequency synthesizer with a hard limiter provides enhancements in output frequency resolution and clarity, at substantially faster switching speeds, over the prior art devices. Further, such a phase lock loop frequency synthesizer requires only one phase lock loop and one DDS. DDS's are typically VLSI devices and therefore require relatively little space or power. Thus, the hardware, space, and power requirements of the DDS driven phase lock loop frequency synthesizer are substantially less than that of a conventional multi-loop frequency synthesizer.

The DDS driven phase lock loop frequency synthesizer also eliminates the wideband spurious noise associated with the mixing of outputs from multiple phase lock loops, because the present invention requires no such mixing. The DDS driven phase lock loop frequency synthesizer further suppresses and eliminates spurious noise by coupling a DDS "clean-up" filter between the DDS output and the phase detector input of the phase lock loop. The DDS "clean-up" filter is fundamental to this invention. This filter suppresses and eliminates wideband spurs from the DDS reference signal before the phase lock loop multiplies the magnitude of the spurs. The phase lock loop multiplies the magnitude of the DDS spurs, not the relative frequency. Therefore, the output of the phase lock loop will contain DDS spurious tones within $\pm B/2$ of the output frequency, $f_{out}$ where B is the bandwidth of the "clean-up" filter. Spurious signals will be suppressed beyond $f_{out} \pm B/2$. This principle is ideal in situations where the synthesizer output is to be modulated, since the close-in DDS spurs can be hidden in the modulated spectrum.

A high order "clean-up" filter with sharp cut-offs can be physically realized more easily at certain frequencies. These frequencies are typically much higher than the desired phase lock loop reference frequency. This allows for the effective placement of the "clean-up" filter center frequency, while still providing the loop with an appropriate reference frequency. The nominal output of the DDS is set at a frequency at which a good "clean-up" filter can be realized.

A fixed value frequency divider may be positioned between the output of the "clean-up" filter and the reference input to the phase lock loop. This frequency divider divides the filtered DDS output signal down in frequency to an appropriate reference frequency for the phase lock loop. It is known that a frequency divider has the property of lowering spurious phase noise by a factor of its divisor value. Therefore the frequency divider further suppresses any narrow band spurious noise which passes through the "clean-up" filter.

The preferred embodiments of the present invention therefore provide several advantages and improvements over prior art frequency synthesizers. These improvements include finer output frequency resolution, cleaner output signal frequency, flexibility in waveform generation, faster switching time, a reduction in hardware, space, and power requirements, and improved noise characteristics.

BRIEF DESCRIPTION OF THE DRAWINGS

The features, objects, and advantages of the present invention will become more apparent from the detailed description set forth below when taken in conjunction with the drawings wherein.

DETAILED DESCRIPTION OF THE PREFERRED EMBODIMENTS

Prior art frequency synthesizers typically utilize multiple phase lock loops to obtain frequency resolution and cover the desired bandwidth. Such multi-loop designs usually incorporate frequency mixers to combine the outputs of the loops. It is well known that such mixers inherently introduce spurious intermodulation products. Many broadband spurs are typically generated, as opposed to the close in and readily predictable spurs created by a direct digital synthesizer.

Furthermore, conventional multi-loop synthesizers involve a large amount of circuitry and require a large amount of power, particularly if fine resolution is to be obtained. It is impractical to provide as fine a resolution as the present invention allows using a multi-loop synthesizer unless one loop is replaced by a digital direct synthesizer. However, this approach to frequency synthesis also involves a large amount of circuitry, and generates spurious intermodulation products due to the mixing required. Again by contrast, the use of a DDS in driving a single phase lock loop requires little circuitry and power; can be made to occupy very little space; and offers excellent frequency resolution, spurious and noise performance, and switching speed. In these respects the frequency synthesizer of the present invention is far superior to the prior art.

The use of a direct digital synthesizer (DDS) for frequency synthesis is well known in the art. However, what is before unknown is the use of a hard limiter, i.e., an amplitude limiter, for limiting the amplitude of the analog signal output from the DDS. The use of a limiter is found to significantly reduce spurious noise in the DDS generated analog signal. The noise which the limiter removes is essentially an amplitude modulated (AM) noise. This AM noise is quantization spurious emissions due to the digital to analog converter (DAC) in the DDS. The DDS also generates phase modulated (PM) noise. Both the AM and PM noise affect the frequency purity of the DDS output signal. It is thus realized that by limiting the amplitude of the DDS output analog signal, along with filtering unwanted frequency noise spurs, a signal of significantly enhanced spectral purity may be produced. Although the limiter serves to eliminate the AM noise, PM spurs are not affected. It should further be noted that the orientation of the filter and limiter in series at the output of the DDS can provide signals of differing waveforms as is described later herein.

Figure 1:
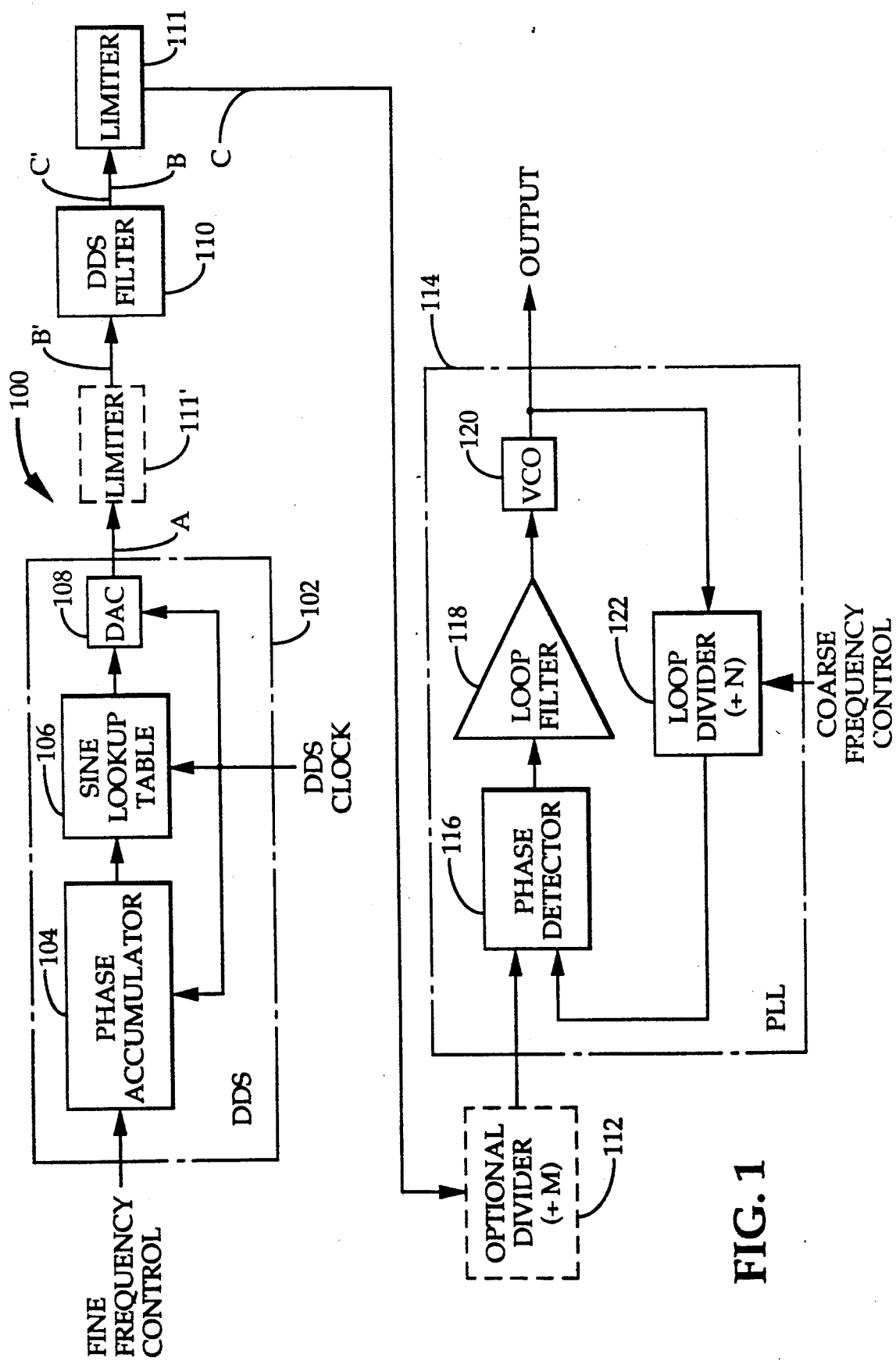
FIG. 1 illustrates in a block diagram one embodiment of a frequency synthesizer in which a direct digital synthesizer, with output filtering and limiting, is used to drive a phase lock loop frequency.

Although the DDS, limiter and filter may be used alone as a frequency synthesizer, it can be used in various arrangements to construct a frequency synthesizer of greater scope. FIG. 1 illustrates such an exemplary embodiment of a frequency synthesizer wherein the DDS drives, through a filter and limiter, a phase lock loop. In FIG. 1, frequency synthesizer 100 is configured with direct digital synthesizer (DDS) 102 driving a phase lock loop. DDS 102 serves as a variable reference source means for generating a selected one of a plurality of reference frequency signals, each at a different frequency.

DDS 102 typically comprises phase accumulator 104, sine lookup table 106 and digital to analog converter (DAC) 108. Phase accumulator 104 receives a digital fine frequency control signal which determines the phase increment for accumulation at the DDS clock rate. The accumulated phase value is output to sine lookup table 106, typically a read only memory which stores sine values. Sine lookup table 106 provides an output signal, indicative of the digital representation of a periodic waveform, as an input to DAC 108. DAC 108 converts the digital representation of the periodic waveform into an analog amplitude value as the output reference signal which is an analog representation of the periodic waveform. DDS 102 is responsive to the fine frequency control signal for altering the frequency of the output reference signal. DDS 102 is further responsive to a direct digital synthesizer clock signal with which its internal digital hardware is driven.

The output from DDS 102, specifically DAC 108, is provided to an input of direct digital synthesizer "cleanup" filter 110. Filter 110 serves as a filter means for enhancing the spectral purity of the reference signal output from DAC 108. The enhanced reference signal output from filter 110 is coupled as an input to limiter 111.

Limiter 111 is conventionally referred to as a "hard" limiter in that it limits the maximum amplitude of the filtered reference signal to a predetermined level. The output of limiter 111 is provided as a limited/enhanced reference signal to an input of optional frequency divider 112. Should divider 112 not be used, the output of limiter 111 is provided as an input to phase lock loop 114, and more particularly as an input to phase detector 116.

Limiter 111 may be constructed in many different forms. One simple form is that of back-to-back diodes. Another form of a limiter is that of a saturating amplifier, such as the case of an op amp voltage comparator. Another form in which the limiter may be is that of an inverter logic gate having the output coupled to the input through a resistor of such a value as 100 K$\Omega$.

Limiter 111 is utilized to suppress the amplitude modulated (AM) spurious components from the DDS generated signal. The spurious components are the AM portion of the amplitude quantization process as well as the AM portion of the thermal noise. As AM spurs have an unpredictable effect upon the phase lock loop output performance, the use of the limiter facilitates elimination of these AM spurs.

Figure 3A:
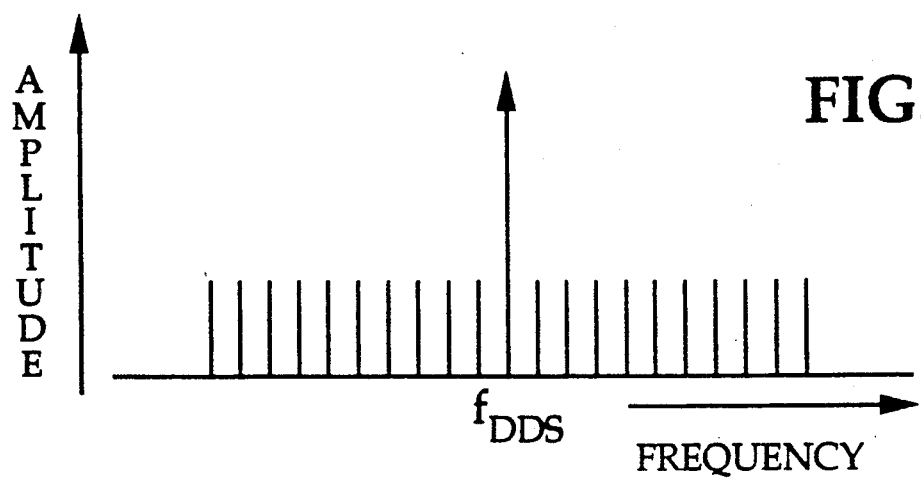
FIGS. 3A-3C illustrate, in a series of graphs, the amplitude versus frequency spectrum of the DDS generated reference for the embodiment of FIG. 1.
Figure 3B:
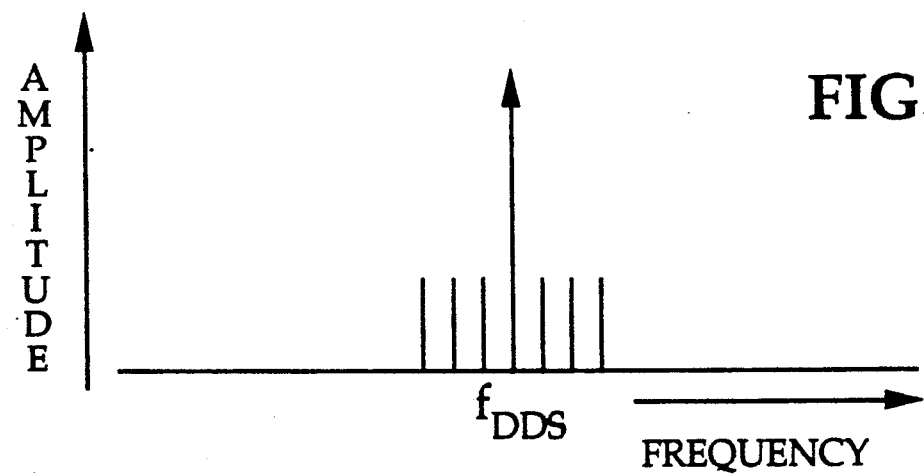
Figure 3C:
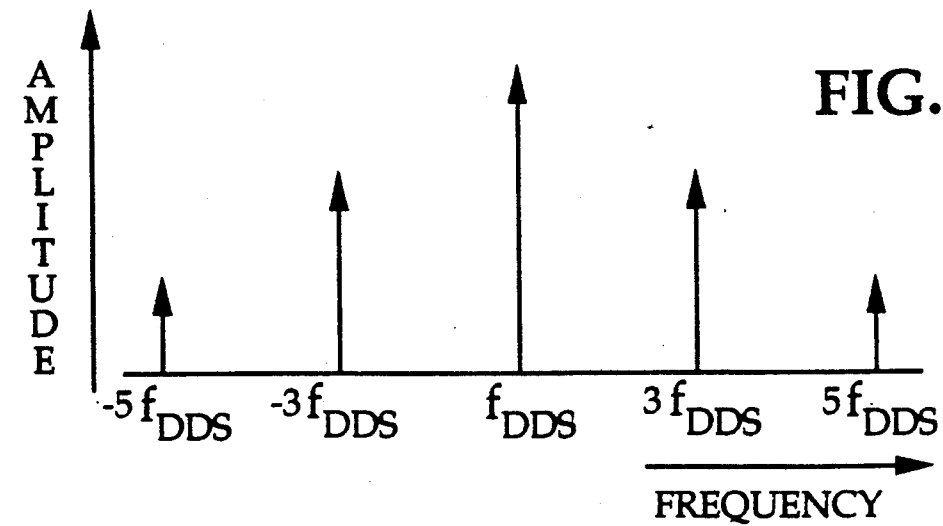

For purposes of further understanding of the combination of filter 110 and limiter 111 in frequency synthesizer 100, FIGS. 3A-3C are provided. The frequency spectrum of the signals as output from DDS 102, filter 110 and limiter 111 is respectively graphically illustrated in FIGS. 3A-3C. FIG. 3A corresponds to the frequency spectrum of the signal output from DDS 102 to filter 110 at point A of FIG. 1. Similarly FIGS. 3B and 3C respectively correspond to the signals at points B and C as respective outputs from filter 110 and limiter 111 of FIG. 1.

For purposes of illustration in FIGS. 3A–3C, only the AM spurs are illustrated as a function of amplitude with respect to frequency. In FIG. 3A, the output of the DDS at point A is characterized as a strong signal at the fundamental frequency, $f_{DDS}$, surrounded by much weaker spurious signals at various frequencies. In FIG. 3B, the output of the bandpass filter at point B is characterized again as a strong signal at the fundamental frequency, $f_{DDS}$, but surrounded by much weaker spurious signals only within the pass band of the filter. Hence the filter eliminates all spurs at out of band frequencies. In FIG. 3C, the output of the limiter at point C is characterized again as a strong signal at the fundamental frequency. However, substantially all AM spurious signals are eliminated with the exception of signals at the higher uneven order harmonics of the fundamental frequency, i.e. $\pm 3f_{DDS}, \pm 5f_{DDS}$, etc. These harmonics of the fundamental frequency are of greater signal strength than the eliminated spurs but decrease in strength as the order of harmonic increases.

In an alternate configuration of the frequency synthesizer of FIG. 1, limiter 111 is removed from between the output of filter 110 and the input of divider 112, and inserted between the output of DAC 108 and the input of filter 110. In this arrangement, the limiter is illustrated in FIG. 1 in dashed lines and identified by the reference numeral 111'. Accordingly, the signal output from DDS 102 is limited in amplitude and provided to an input of filter 110. Filter 110, as before, filters undesirable frequency components from the amplitude limited reference signal. The limited/enhanced reference signal as output from filter 102 is provided as an input to divider 112. Should divider 112 not be used, the output of filter 110 is provided as an input to phase lock loop 114, and more particularly as an input to phase detector 116.

Figure 4A:
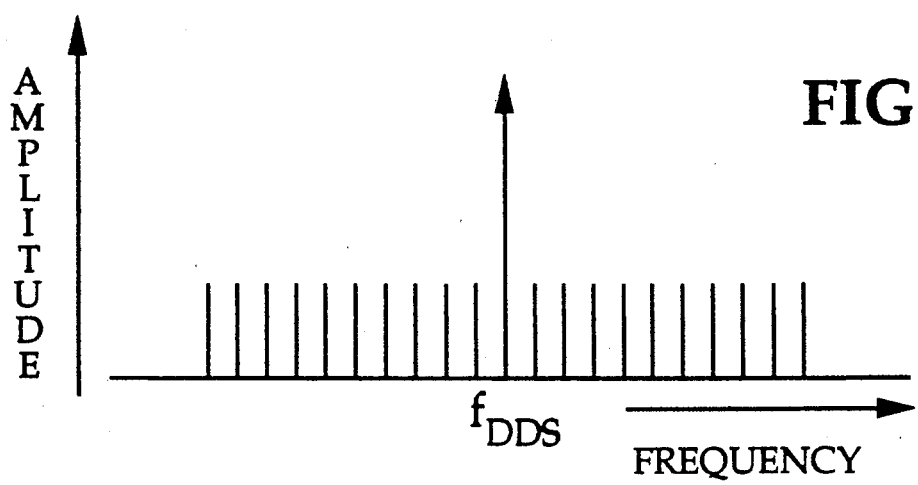
FIGS. 4A-4C illustrate, in a series of graphs, the amplitude versus frequency spectrum of the DDS generated reference for the alternative embodiment of FIG. 1.
Figure 4B:
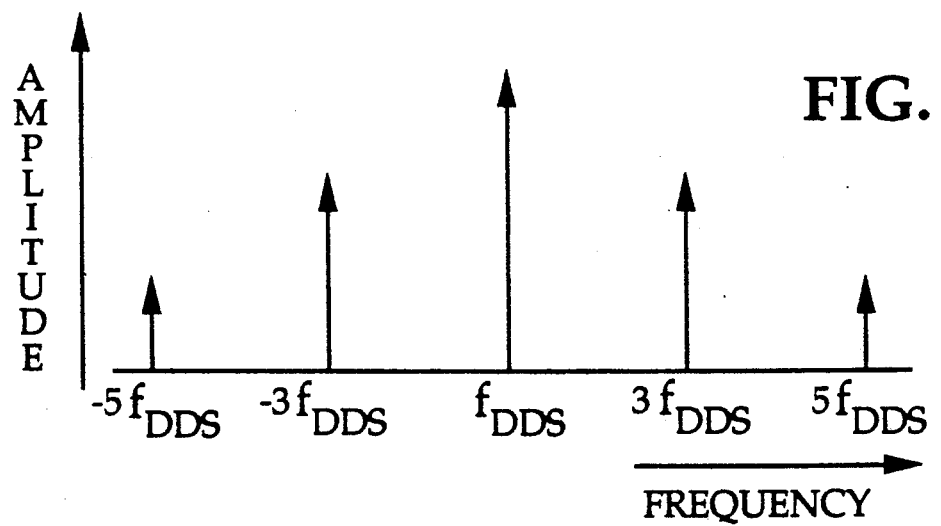
Figure 4C:
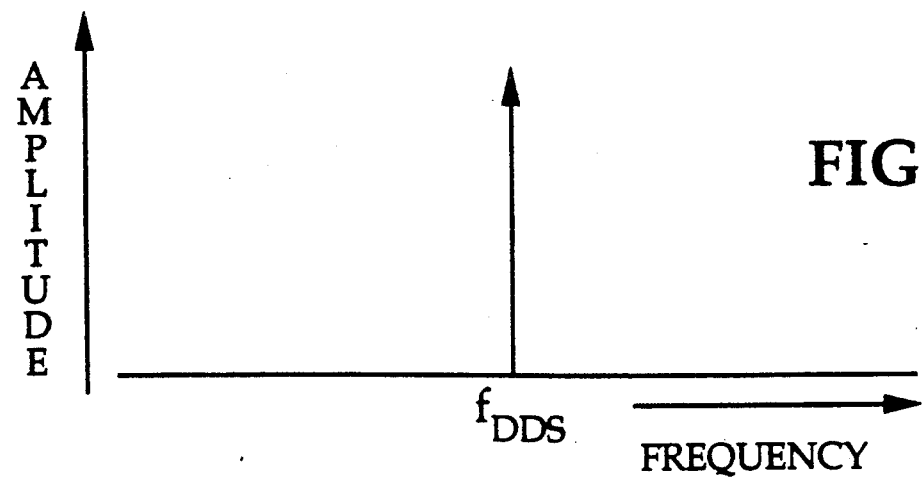

For purposes of further understanding of the combination of filter 110 and limiter 111' in frequency synthesizer 100, FIGS. 4A–4C are provided. The frequency spectrum of the signals as output from DDS 102, limiter 111' and filter 110 is respectively graphically illustrated in FIGS. 4A–4C. In FIG. 4A corresponds to the frequency spectrum of the signal output from DDS 102 to limiter 111' at point A of FIG. 1. Similarly, FIGS. 4B and 4C respectively correspond to the signals at points B' and C' as respective outputs from limiter 111' and filter 110 of FIG. 1.

For purposes of illustration in FIGS. 4A–4C, only the AM spurs are illustrated as a function of amplitude with respect to frequency. In FIG. 4A, the output of the DDS at point A is characterized as a strong signal at the fundamental frequency, $f_{DDS}$, surrounded by much weaker spurious signals at various frequencies as was for FIG. 3A. In FIG. 4B, the output of the limiter at point B' is characterized again as a strong signal at the fundamental frequency, $f_{DDS}$, with substantially all spurious signals eliminated with the exception of signals at the higher uneven order harmonics of the fundamental frequency, i.e. $\pm 3f_{DDS}, \pm 5f_{DDS}$, etc. These harmonics of the fundamental frequency are of greater signal strength than the eliminated spurs but decrease in strength as the order of harmonic increases. In FIG. 4C, the output of the bandpass filter at point C' is characterized again as a strong signal at the fundamental frequency with the harmonics eliminated by the filter since they are out of band signals.

Returning again to FIG. 1, divider 112 serves as a reference signal divider means for generating a divided reference signal having a periodic frequency equal to the frequency of the limited/enhanced reference signal divided by a predetermined integer value, M. The frequency divided reference signal is provided to phase lock loop 114 as the phase lock loop reference frequency.

In the preferred embodiment phase lock loop 114 is comprised of phase detector 116, loop filter 118, voltage controlled oscillator (VCO) 120 and loop divider 122. Phase lock loop 114 serves as a frequency tuning means for generating a loop output signal having a periodic frequency which is an integer multiple of the frequency of the input reference signal.

One input of phase detector 116 is coupled to the output of limiter 111, or divider 112 if provided. In the alternate embodiment, i.e., limiter 111' positioned at the output of DDS 102, the output of filter 110 or divider 112 if provided, is coupled to on input of phase detector 116. The output of phase detector 116 is coupled to an input of loop filter 118, typically constructed as an op amp filter. The output of loop filter 118 is coupled to a control input of VCO 120. The output of VCO 120 is provided as the phase lock loop output signal and is also fed back to an input of loop divider 122. The output of loop divider 122 is coupled as the other input of phase detector 116.

Phase detector 116 serves as a comparator means for comparing the DDS circuitry provided reference signal to the divided loop output signal. Phase detector 116 is responsive to a difference in phase of the reference signal from the DDS circuitry and the divided loop output signal for generating a frequency tuning control signal. Phase detector 116 generates the frequency tuning control signal whose voltage level is proportional to the difference in frequencies of the compared signals.

Loop filter 118 serves as a tuning control signal filter. Loop filter 118 receives and filters the frequency tuning control signal and provides a VCO control signal. The VCO control signal is provided to the voltage control input of VCO 120.

VCO 120 serves as a frequency generation means for generating the loop output signal in response to the VCO control signal. Specifically, VCO 120 alters the frequency of the loop output signal in response to a change in the voltage level of the input VCO control signal.

Loop divider 122 is coupled to the output of VCO 120 so as to receive the loop output signal. Loop divider 122 serves as a loop divider means which receives the loop output signal and generates a divided loop signal which corresponds in frequency to the loop output signal divided by N. The divided loop signal is provided to the other input of phase comparator 116. Loop divider 122 is responsive to a coarse frequency control signal for setting the integer divisor value by which the loop output signal frequency is divided for feedback to phase detector 116.

In operation, the DDS produces digitized periodic waveforms, typically a sine wave although a square wave may as easily be generated, of a given frequency by accumulating phase at a higher rate. The accumulated phase is translated to a periodic waveform via a lookup table. The resulting digital representation of the periodic waveform is translated to analog form using a digital to analog converter.

Phase lock loop 114 is designed to output a range of frequencies where the frequency resolution is equal to its reference frequency. For example, phase lock loop 114 is designed for loop output signals that can vary from 200-400 MHz. If the reference frequency applied to phase lock loop 114 is 10 MHz, the possible outputs from phase lock loop 114 are 200, 210, 220, 230, . . . , 390, and 400 MHz. The frequency of each phase lock loop output signal is the division ratio of the loop, the value by which output divider 122 divides, multiplied by the reference frequency. For example, loop divider 122 is set to divide the loop output frequency by 27 (N=27) to generate a loop output signal at a frequency of 270 MHz. By using a DDS as the reference to the loop, the reference frequency may be made to vary in extremely small steps. Note that the step size of the DDS driven phase lock loop varies with the divisor value of the loop divider (N) and is therefore not constant throughout the range of output frequencies.

Filter 110 is a critical component and is preferably a bandpass filter designed with as narrow a bandwidth and as steep a roll-off as possible. This filter may therefore be a crystal filter or a surface acoustic wave (SAW) filter. Use of the optional divider 112 provides versatility in selection of the center frequency of filter 110. For example, it is sometimes difficult to obtain a crystal filter with a center frequency of 7 MHz, but straightforward to specify a center frequency of 10 MHz. A design which requires a reference frequency to phase lock loop 114 of 1 MHz can therefore be realized. Accordingly, a DDS output signal with its frequency centered at 10 MHz, is provided as an input to a 10 MHz crystal filter. The output of the crystal filter is provided to a fixed divided by 10 divider before being applied at the phase lock loop input. Divider 112 has the added benefit of reducing the amplitude of the DDS phase noise and spurious content by 20 log(M) dB, where M is the fixed division ratio.

The spurious performance of the frequency synthesizer of FIG. 1 may be readily analyzed. The DDS output includes spurious signals typically caused by phase truncation of the output waveform, amplitude quantization of the waveform, nonlinearities of the DAC output, and aliases attributable to the sampling process. The phase noise in the DDS output is governed by the phase noise characteristics of the DDS clock signal, as well as the noise performance of the digital circuitry comprising the DDS. As was discussed earlier with reference to FIGS. 3A-3C and 4A-4C, many of the noise spurs may be significantly reduced or eliminated.

Phase lock loop 114 acts as a low pass filter to signals applied to its reference input. In the case of a second order loop, the loop has second order low pass filter characteristics with a bandwidth equal to the phase lock loop bandwidth. Reference spurs and phase noise are multiplied in the loop by the factor N in voltage or 20 log(N) in dB, where N is the divisor value of loop divider 122. The loop output signal is therefore characterized by the output frequency surrounded by a bandpass spectrum of multiplied reference spurs and phase noise. In the absence of filter 110 and limiter 111 (or limiter 111'), this spectrum is the spurious content of the DDS output plus 20 log(M) dB, and suppressed by 6 dB per octave outside of the phase lock loop bandwidth. Filter 110 is utilized to provide suppression of spurious signals and phase noise, particularly those generated by the DDS.

One significant property of a phase lock loop is that it multiplies the amplitude of the DDS spurious signals by N. However, the frequency difference between the phase lock loop synthesizer output frequency and the spur remains the same as that between the DDS output frequency and the DDS spur frequency. Depending upon the amplitude of the DDS spur with respect to the DDS output frequency, an FM modulation of the phase lock loop synthesizer output may occur. This modulation produces a family of spurs harmonically related to the DDS spur, decreasing in amplitude with the order of the harmonic. These FM spurs remain close in to the synthesizer output frequency and in general fall off rapidly. Therefore, spurs may be present at the synthesizer output within a bandwidth equal to that of filter 110 surrounding the output frequency. But beyond this the output can be made arbitrarily clean by selecting a filter 110 with a sufficient shape factor and ultimate attenuation. However, as previously discussed, the use of filter 110 and limiter 111 serves to reduce the overall spurs generated by DDS 102.

As a further illustrative example of the frequency synthesizer of FIG. 1, consider again the example of a synthesizer required to output a frequency in the range of 200 to 400 MHz. Assume that phase lock loop 114 has 1 MHz step resolution. The reference input to phase lock loop 114 is centered at 1 MHz, and the value of the divisor of loop divider 122, N, is in the range $200 \leq N \leq 400$. The output of the synthesizer is in steps of N times the reference frequency input to the phase lock loop from the DDS and filter/limiter arrangement. The DDS must output a range of frequencies sufficient to bridge the 1 MHz phase lock loop resolution. The bandwidth of the output of the DDS is therefore the loop frequency resolution divided by the minimum value of N, e.g. 1 MHz/200 which equals 5 KHz. The DDS must therefore output a signal at 1 MHz±2.5 KHz.

The resolution of the synthesizer is that of the DDS times N. With a typical DDS frequency resolution of 0.01 Hz, the synthesizer resolution varies from 2 Hz at the low frequency end to 4 Hz at the high frequency end. Ignoring transient response issues, filter 110 can be made as narrow as possible, i.e. approximately 6 KHz, 1 dB bandwidth. The synthesizer will output spurious signals attributable to the DDS within ±3 KHz of the output tone, and falling off per the characteristic of filter 110, the characteristic of limiter 111, plus the loop response. The maximum level of these spurious signals in dB is the maximum level of the DDS spurs within the clean-up filter bandwidth plus 52 dB, where 52 dB is 10 log($N_{max}$), i.e., 10 log(400). Similarly, DDS phase noise is multiplied by 52 dB maximum, and is filtered both by filter 110 and the loop response. The synthesizer therefore produces close in spurious signals and a close in phase noise pedestal due to the reference, but no theoretical spurs far beyond the clean-up filter and loop bandwidth.

The transient response and switching time of the frequency synthesizer of FIG. 1 is established by the bandwidth of filter 110 and the loop characteristics of phase lock loop 114. A DDS has switching times typically less than 100 nsec, and therefore does not significantly effect the switching time. The settling time of a phase lock loop is inversely related to the loop bandwidth. To maintain loop stability, the loop bandwidth of a phase lock loop can typically be no wider than five to ten percent of the frequency step size. The design of the frequency synthesizer of FIG. 1 provides remarkably fine frequency resolution with a phase lock loop having a relatively large frequency step size, and therefore a wide permissible loop bandwidth. The phase lock loop of the the embodiment of FIG. 1 will settle very quickly.

Therefore, in the embodiment of FIG. 1, switching time will be governed by the transient characteristic of filter 110, rather than the loop bandwidth of phase lock loop 114. The selection of filter 110 is a tradeoff between the spurious noise performance and switching speed of the synthesizer.

Note that in the above example, DDS 102 and filter 110 could have been centered at 10 MHz and followed by divider 112 with a divisor value of 10. This circuitry would provide the 1 MHz±2.5 KHz input to phase lock loop 114. The bandwidth of the filter 110 at 10 MHz would be approximately 60 KHz, providing faster settling time than the 6 KHz design. While the wider bandwidth clean-up filter passes a greater range of DDS spurs and noise, this is offset somewhat by the 20 dB improvement afforded by divider 112.

Figure 2:
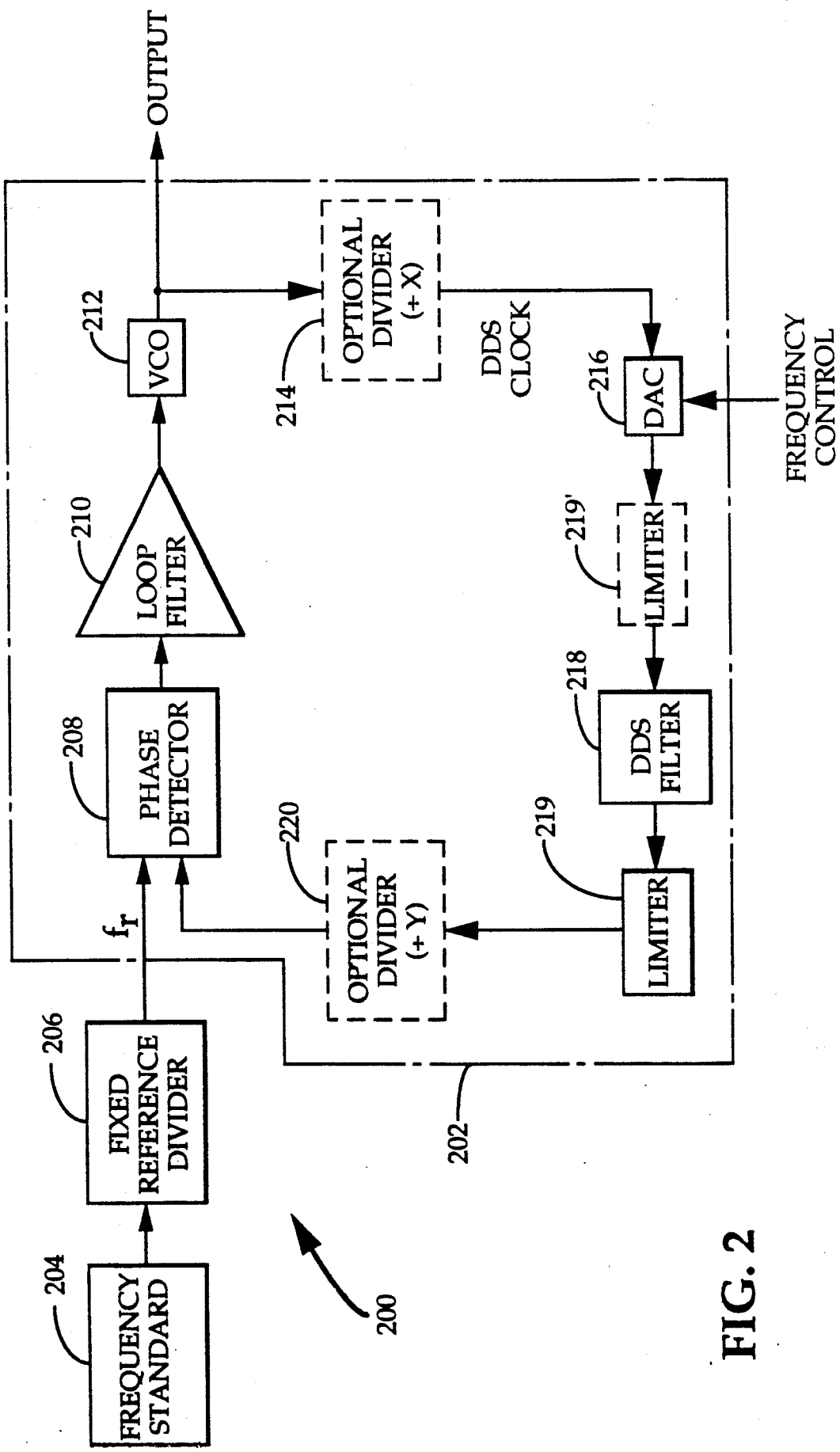
FIG. 2 illustrates an alternative embodiment of a DDS driven phase lock loop frequency synthesizer with the DDS within the phase lock loop.

FIG. 2 illustrates in block diagram form of an alternate embodiment of a frequency synthesizer which incorporates a DDS within the phase lock loop. In FIG. 2, synthesizer 200 includes circuit 202 which comprises a phase lock loop incorporating within the loop a direct digital synthesizer. Circuit 202 receives a reference frequency, typically from a frequency standard 204, through fixed reference divider 206. The frequency of the frequency standard output signal is divided by fixed reference divider 206 for input to circuit 202.

Circuit 202 comprises phase detector 208, loop filter 210, VCO 212, optional loop divider 214, DDS 216, DDS cleanup filter 218, limiter 219 and optional loop divider 220. The output from fixed reference divider 206, $f_r$, is provided as one input to phase detector 208. The output of phase detector 208 is coupled as previously discussed to the input of loop filter 210. The output of loop filter 210 is coupled as the control voltage to VCO 212.

The output of VCO 212 is provided as the frequency synthesizer output with the VCO output signal also fed back either directly or through optional loop divider 214 to the DDS clock input of DDS 216. DDS 216 is provided with a frequency control input signal which is used to set the DDS frequency. The output of DDS 216 is to provided to filter 218. The output of filter 218 is provided to the input of limiter 219. The output of limiter 219 is provided either directly to or through optional loop divider 220 to the other input of phase detector 208. In an alternative embodiment, limiter 219 may be removed from the output of filter 218 and inserted at the input thereof. In this variation of the embodiment of FIG. 2, the limiter is illustrated by the dashed lines indicated by the reference numeral 219'.

In the particular embodiment of FIG. 2, the synthesizer output frequency is a function of the reference frequency $f_r$, input to phase detector 208 from fixed reference divider 206; the number of bits in the digital word of the frequency control signal which controls DDS 216, N; the DDS step size determined by the frequency control signal, A; and the values of the dividers 214 and 220, respectively X and Y. The following equation expresses the synthesizer output frequency $f_o$:

$$f_o = f_r * 2^{-N} * (X*Y/A). \tag{1}$$

In the embodiment of FIG. 2, DDS 216 and filter 218 are incorporated within the phase lock loop feedback path. Accordingly, filter 218 now has an affect upon the dynamics of the phase lock loop. In order to ensure loop stability, the bandwidth of filter 218 must be wide when compared to that of the loop bandwidth. Furthermore, it should be noted that the synthesizer step size is not constant, but is a function of the variable A, the frequency control signal. However, the embodiment of FIG. 2 realizes all of the other advantages of the embodiment of FIG. 1.

It is further envisioned that with respect to the embodiments of FIGS. 1 or 2 that several such circuits may be combined wherein each frequency synthesizer provides an output signal to a switching device, such as an FET transistor or PIN diode switch. Such a switching device would provide selection between the outputs of the multiple frequency synthesizer for an ultimate output signal. It should be readily understood that many various modifications utilizing the DDS and a phase lock loop forming a frequency synthesizer may be realized using the teachings disclosed herein.

Figure 5A:
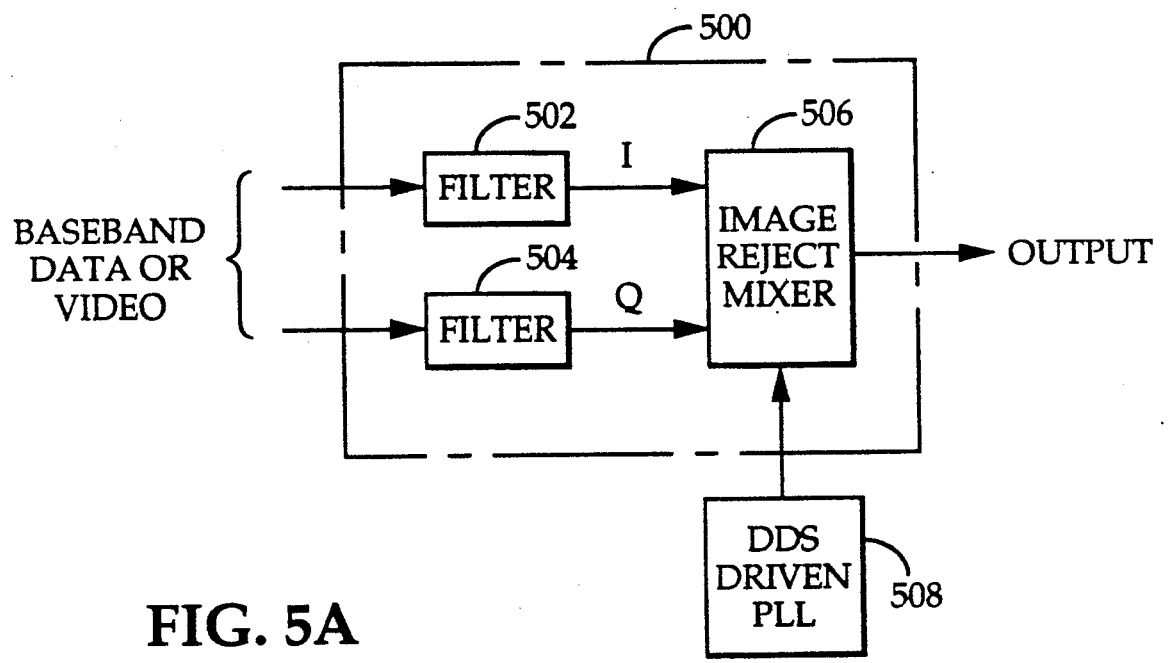
FIG. 5A illustrates an exemplary application of the DDS driven phase lock loop.

FIG. 5A illustrates in block diagram form an exemplary application of the DDS driven phase lock loop described herein. In FIG. 5A, upconverter 500 is comprised of low pass filters 502 and 504, and image reject mixer 506. I and Q channel baseband data or video signals are respectfully input to filters 502 and 504. The filtered I and Q channel signals are output from filters 502 and 504 to image reject mixer 506. DDS driven phase lock loop 508 generates a local oscillator signal for input to image reject mixer 506 of upconverter 500 where the input signals are upconverted in frequency. The frequency upconverted signals are output from image reject mixer 506.

Figure 5B:
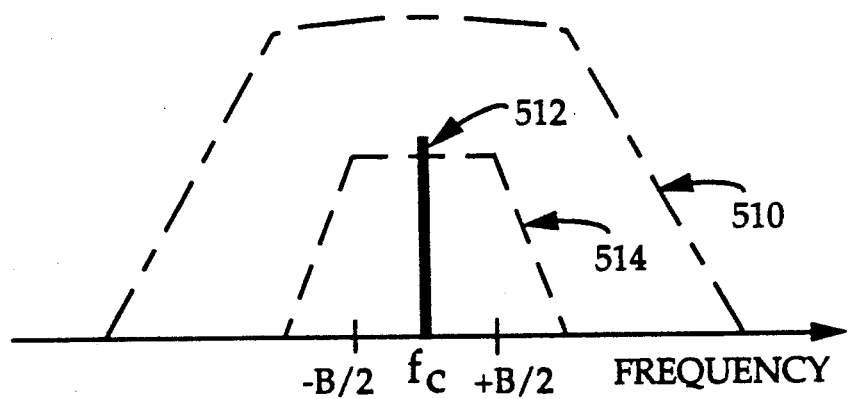
FIG. 5B illustrates the resulting frequency spectrum in the application of the DDS driven phase lock loop of FIG. 5A.

As illustrated in FIG. 5B, the DDS driven phase lock loop generated signal appears spur-free when used to upconvert a relatively wide data or video spectrum. In FIG. 5B, the frequency upconverted data or video spectrum envelope is illustrated by the dashed line 510. The carrier frequency $f_c$ is indicated by the reference numeral 512. Furthermore, the envelope of potential spurious tones is indicated by the dashed line 514. Should the demodulation circuitry have no problem demodulating a signal with close-in spurious tones, typically 20-35 dBC, the DDS driven phase lock loop frequency synthesizer approach may be ideal.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for synthesizing frequencies, comprising:
   variable reference means for generating a periodic signal of a frequency selected from a plurality of reference frequencies, said variable reference means comprising:
   phase accumulator means for, receiving a digital frequency control signal indicative of a selected phase increment value, receiving an externally generated clock signal, accumulating phase increment values at a rate corresponding to said clock signal, and providing an accumulator output signal corresponding to said accumulated phase increment values, memory means for, storing a plurality of amplitude values each corresponding to a respective accumulated phase increment value, receiving said accumulator output signal and providing a memory output signal indicative of the amplitude value corresponding to each accumulated phase increment value of said accumlator output signal, and converter means for, receiving said memory output signal, converting said received memory output signal to an analog amplitude signal corresponding to said memory output signal amplitude values and providing said analog amplitude signal as said periodic signal; and limiter means for receiving and amplitude limiting said periodic signal; and frequency tuning means for receiving said amplitude limited periodic signal and generating an output signal of a frequency which is a multiple of said periodic signal frequency.

2. The apparatus of claim 1 wherein said frequency tuning means comprises:

phase detector means for, receiving said amplitude limited periodic signal and a feedback signal, detecting a phase difference between said amplitude limited periodic signal and said feedback signal, and providing a corresponding error signal;

loop filter means for, receiving said error signal, filtering noise in said error signal, and providing said filtered error signal as a control signal;

variable oscillator means for receiving said control signal and responsive thereto for generating said output signal; and divider means for, receiving said output signal, dividing said output signal frequency by N and providing said feedback signal corresponding in frequency to said output signal frequency divided by N, wherein said output signal frequency is N times said periodic signal frequency.

3. The apparatus of claim 1 further comprising filter means, disposed between said variable reference means and said limiter means, for receiving said periodic signal, enhancing the spectral purity of said periodic signal and providing said spectral purity enhanced periodic signal to said limiter means.

4. The apparatus of claim 1 further comprising filter means, disposed between said limiter means and said frequency tuning means, for receiving said amplitude limited periodic signal, enhancing the spectral purity of said amplitude limited periodic signal and providing said spectral purity enhanced amplitude limited periodic signal to said frequency tuning means.

5. The apparatus of claim 2 further comprising filter means, disposed between said converter means and said limiter means, for receiving said periodic signal, enhancing the spectral purity of said periodic signal and providing said spectral purity enhanced periodic signal to said limiter means.

6. The apparatus of claim 2 further comprising filter means disposed between said limiter means and said phase detector means, for receiving said amplitude limited periodic signal, enhancing the spectral purity of said amplitude limited periodic signal and providing said spectral purity enhanced amplitude limited periodic signal to said phase detector means.

7. The apparatus of claim 5 further comprising additional divider means disposed between said limiter means and said phase detector means for receiving said spectral purity enhanced amplitude limited periodic signal and providing to said phase detector means a divided frequency periodic signal corresponding in frequency to said periodic signal frequency divided by M, said output signal frequency being N times said divided frequency periodic signal frequency.

8. The apparatus of claim 6 further comprising additional divider means disposed between said filter means and said phase detector means for receiving said spectral purity enhanced amplitude limited periodic signal and providing to said phase detector means a divided frequency periodic signal corresponding in frequency to said periodic signal frequency divided by M, said output signal frequency being N times said divided frequency periodic signal frequency.

9. A frequency synthesizer comprising:

a direct digital synthesizer (DDS) having, a fine frequency control input and a DDS clock input for respectively receiving externally generated phase data and an externally generated clock signal, and an output at which a reference signal is provided;

a filter having an input, coupled to said DDS output, and an output;

a limiter having an input, coupled to said filter output, and an output; and a phase lock loop having a loop input coupled to said limiter output, a coarse frequency control input for receiving a divide-by-N signal, and a loop output wherein said loop provides at said loop output a synthesizer output signal of a frequency N times the frequency of said reference signal.

10. The synthesizer of claim 9 further comprising a frequency divider, disposed between said limiter and said phase lock loop, having an input coupled to said limiter output and an output coupled to said loop input, said frequency divider for dividing said reference signal frequency by M with said phase lock loop having a frequency of N times said reference signal frequency divided by M.

11. The synthesizer of claim 9 wherein said direct digital synthesizer comprises:

a phase accumulator having a phase data input for receiving said phase data, an accumulator clock input for receiving said clock signal, and an accumulator output;

a read only memory having a plurality of addressable storage locations each storing a predetermined sine value, an address input coupled to said accumulator output, a memory clock input for receiving said clock signal and a memory output;

a digital to analog converter having a converter input coupled to said memory output, a converter clock input for receiving said clock signal and a converter output.

12. The frequency synthesizer of claim 9 wherein said phase lock loop comprises:

a phase detector having a reference input coupled to said limiter output, a feedback input and a detector output;

a loop filter having a loop filter input; coupled to said detector output, and a loop filter output;

a voltage controlled oscillator having a control input, coupled to said loop filter output, and an oscillator output, said synthesizer output signal being provided at said oscillator output; and a variable frequency divider having a divider input coupled to said oscillator output, a divider control input for receiving said divide-by-N signal, and a divider output coupled to said detector feedback input.

13. The frequency synthesizer of claim 11 wherein said phase lock loop comprises:

a phase detector having a reference input coupled to said limiter output, a feedback input and a detector output;

a loop filter having a loop filter input coupled to said detector output and loop filter output;

a voltage controlled oscillator having a control input, coupled to said loop filter output, and an oscillator output, said synthesizer output signal being provided at said oscillator output; and a variable frequency divider having a divider input coupled to said oscillator output, a divider control input for receiving said divide-by-N signal, and a divider output coupled to said detector feedback input.

14. The synthesizer of claim 13 further comprising a frequency divider, disposed between said limiter and said phase lock loop, having an input coupled to said limiter output and an output coupled to said reference input, said frequency divider dividing said reference signal frequency by M, with said synthesizer output signal being of a frequency of N times said reference signal frequency divided by M.

15. A phase lock loop frequency synthesizer comprising:

a phase detector having a reference input for receiving an externally generated reference signal of a predetermined frequency, a feedback input and an output;

a loop filter having an input, coupled to said detector output, and an output;

a voltage controlled oscillator having an input, coupled to said loop filter output, and an output for providing a synthesizer output signal;

a direct digital synthesizer (DDS) having a DDS clock input coupled to said oscillator output, a frequency control input for receiving externally generated phase data, and an output;

a bandpass filter having an input coupled to said DDS output and an output; and a limiter having an input coupled to said band pass filter output and an output coupled to said detector feedback input.

16. The synthesizer of claim 15 wherein said direct digital synthesizer comprises:

a phase accumulator having a phase data input for receiving said phase data, an accumulator clock input coupled to said oscillator output, and an accumulator output;

a read only memory having a plurality of addressable storage locations each storing a predetermined sine value, an address input coupled to said accumulator output, a memory clock input coupled to said oscillator output and a memory output;

a digital to analog converter having a converter input coupled to said memory output, a converter clock input coupled to said oscillator output, and a converter output coupled to said bandpass filter input.

17. The synthesizer of claim 15 further comprising a first loop divider, disposed between said oscillator and said DDS, having an input coupled to said oscillator output and an output coupled to said DDS clock input, said first loop divider dividing said synthesizer output signal frequency by X as provided to said DDS clock input.

18. The synthesizer of claim 15 further comprising a loop divider, disposed between said limiter and said phase detector, having an input coupled to said limiter output and an output coupled to said detector feedback input, said loop divider dividing a signal output from said DDS in frequency by Y for providing to said detector feedback input.

19. The synthesizer of claim 17 further comprising a second loop divider, disposed between said limiter and said phase detector, having an input coupled to said limiter output and an output coupled to said detector feedback input, said second loop divider dividing a signal output from said DDS in frequency by Y for providing to said detector feedback input.

20. A phase lock loop frequency synthesizer comprising:

a phase detector having a reference input for receiving an externally generated reference signal of a predetermined frequency, a feedback input and an output;

a loop filter having an input, coupled to said detector output, and an output;

a voltage controlled oscillator having an input, coupled to said loop filter output, and an output for providing a synthesizer output signal;

a direct digital synthesizer (DDS) having a DDS clock input coupled to said oscillator output, a frequency control input for receiving externally generated phase data, and an output;

a limiter having an input coupled to said DDS output and an output; and a bandpass filter having an input coupled to said limiter output and an output coupled to said detector feedback input.

21. The synthesizer of claim 20 wherein said direct digital synthesizer comprises:

a phase accumulator having a phase data input for receiving said phase data, an accumulator clock input coupled to said oscillator output, and an accumulator output;

a read only memory having a plurality of addressable storage locations each storing a predetermined sine value, an address input coupled to said accumulator output, a memory clock input coupled to said oscillator output and a memory output;

a digital to analog converter having a converter input coupled to said memory output, a converter clock input coupled to said oscillator output, and a converter output coupled to said limiter input.

22. The synthesizer of claim 20 further comprising a first loop divider, disposed between said oscillator and said DDS, having an input coupled to said oscillator output and an output coupled to said DDS clock input, said first loop divider dividing said synthesizer output signal frequency by X as provided to said DDS clock input.

23. The synthesizer of claim 20 further comprising a loop divider, disposed between said bandpass filer and said phase detector, having an input coupled to said bandpass filer output and an output coupled to said detector feedback input, said loop divider dividing a signal output from said DDS in frequency by Y for providing to said detector feedback input.

24. The synthesizer of claim 22 further comprising a second loop divider, disposed between said bandpass filter and said phase detector, having an input coupled to said bandpass filter output and an output coupled to said detector feedback input, said second loop divider dividing a signal output from said DDS in frequency by Y for providing to said detector feedback input.

25. An apparatus for synthesizing frequencies, comprising:

variable reference means for generating a periodic signal of a frequency selected from a plurality of reference frequencies, said variable reference means comprising:

phase accumulator means for, receiving a digital frequency control signal indicative of a selected phase increment value, receiving an externally generated clock signal, accumulating phase increment values at a rate corresponding to said clock signal, and providing an accumulator output signal corresponding to said accumulated phase increment values, memory means for, storing a plurality of amplitude values each corresponding to a respective accumulated phase increment value, receiving said accumulator output signal and providing a memory output signal indicative of the amplitude value corresponding to each accumulated phase increment value of said accumulator output signal, and converter means for, receiving said memory output signal, converting said received memory output signal to an analog amplitude signal corresponding to said memory output signal amplitude values and providing said analog amplitude signal as said periodic signal;

filter means for receiving said periodic signal, enhancing the spectral purity of said periodic signal and providing an output of said spectral purity enhanced periodic signal; and limiter means for receiving and amplitude limiting said spectral purity enhanced periodic signal.

26. An apparatus for synthesizing frequencies, comprising:

variable reference means for generating a periodic signal of a frequency selected from a plurality of reference frequencies, said variable reference means comprising:

phase accumulator means for, receiving a digital frequency control signal indicative of a selected phase increment value, receiving an externally generated clock signal, accumulating phase increment values at a rate corresponding to said clock signal, and providing an accumulator output signal corresponding to said accumulated phase increment values, memory means for, storing a plurality of amplitude values each corresponding to a respective accumulated phase increment value, receiving said accumulator output signal and providing a memory output signal indicative of the amplitude value corresponding to each accumulated phase increment value of said accumulator output signal, and converter means for, receiving said memory output signal, converting said received memory output signal to an analog amplitude signal corresponding to said memory output signal amplitude values and providing said analog amplitude signal as said periodic signal;

limiter means for receiving and amplitude limiting said periodic signal; and filter means for receiving said amplitude limited periodic signal, enhancing the spectral purity of said amplitude limited periodic signal and providing an output of said spectral purity enhanced amplitude limited periodic signal.

27. A method for synthesizing frequency comprising the steps of:

providing a direct digital synthesizer (DDS) capable of digitally generating an analog DDS output signal at a frequency selected from a plurality of frequencies;

providing externally generated phase data and clock signals to said DDS;

generating in said DDS, in response to said providing of said phase data and said clock signal, said DDS output signal of said selected frequency;

filtering said DDS output signal; and amplitude limiting said DDS output signal.

28. The method of claim 27 further comprising the steps of:

providing a phase lock loop capable of generating a loop output signal at a frequency corresponding to an input reference signal and a divide-by-N signal;

providing to said phase lock loop said filtered amplitude limited DDS output signal, as said reference signal, and said divide-by-N signal; and generating in said phase lock loop, in response to said input of said filtered amplitude limited DDS output signal and said divide-by-N signal, said loop output signal corresponding in frequency to a multiple of N times a frequency of said DDS output signal.

29. The method of claim 28 further comprising the steps of:

dividing said filtered amplitude limited DDS output signal in frequency; and providing said divided frequency signal to said phase lock loop wherein said phase lock loop generates loop output signals at a frequency of N times said DDS output signal frequency divided by M.

30. The method of claim 27 wherein said step of generating said DDS output signal comprises the steps of:

accumulating in an accumulator, at a rate corresponding to said clock signal, said phase data corresponding to phase increment values;

providing an accumulator output signal corresponding to said accumulated phase increment values;

storing in a memory a plurality of amplitude values each corresponding to a respective accumulated phase increment value;

providing a memory output signal indicative of the amplitude value corresponding to each accumulated phase increment value of said accumulator output signal;

converting in a converter said memory output signal to an analog amplitude signal corresponding to said memory output signal amplitude values; and providing said analog amplitude signal as said DDS output signal.

31. The apparatus of claim 25 wherein said variable reference means comprises a direct digital synthesizer, said limiter means comprises a hard limiter, and said filter means comprises a bandpass filter.

32. The apparatus of claim 26 wherein said variable reference means comprises a direct digital synthesizer, said limiter means comprises a hard limiter, and said filter means comprises a bandpass filter.

* * * * *